(12) United States Patent
Zhang

(10) Patent No.: US 8,981,236 B2
(45) Date of Patent: Mar. 17, 2015

(54) PRINTED CIRCUIT BOARD

(71) Applicants: Hong Fu Jin Precision Industry (WuHan) Co., Ltd., Wuhan (CN); Hon Hai Precision Industry Co., Ltd., New Taipei (TW)

(72) Inventor: Feng Zhang, Wuhan (CN)

(73) Assignees: Hong Fu Jin Precision Industry (WuHan) Co., Ltd., Wuhan (CN); Hon Hai Precision Industry Co., Ltd., New Taipei (TW)

(*) Notice: Subject to any disclaimer, the term of this patent is extended or adjusted under 35 U.S.C. 154(b) by 53 days.

(21) Appl. No.: 13/730,874

(22) Filed: Dec. 29, 2012

(65) Prior Publication Data

US 2013/0306362 A1 Nov. 21, 2013

(30) Foreign Application Priority Data

May 21, 2012 (CN) .......................... 2012 1 0157956

(51) Int. Cl.
*H05K 1/00* (2006.01)
*H05K 1/03* (2006.01)
*H05K 1/02* (2006.01)
*H05K 3/34* (2006.01)

(52) U.S. Cl.
CPC .................. *H05K 1/03* (2013.01); *H05K 1/024* (2013.01); *H05K 3/3452* (2013.01); *H05K 2201/0191* (2013.01); *H05K 2201/09727* (2013.01); *H05K 2201/09972* (2013.01)
USPC ............ 174/258; 174/251; 174/261; 174/262

(58) Field of Classification Search
USPC .......... 174/251, 258, 261, 262; 361/739, 748, 361/750, 751, 760
See application file for complete search history.

(56) References Cited

U.S. PATENT DOCUMENTS

| 7,530,167 | B2 * | 5/2009 | Lauffer et al. | 29/852 |
| 2012/0160542 | A1 * | 6/2012 | Oluwafemi et al. | 174/250 |
| 2012/0187581 | A1 * | 7/2012 | Shimada et al. | 257/784 |

* cited by examiner

*Primary Examiner* — Lisa Lea Edmonds
*Assistant Examiner* — Christopher L Augustin
(74) *Attorney, Agent, or Firm* — Novak Druce Connolly Bove + Quigg LLP

(57) ABSTRACT

A printed circuit board includes a line intensive distribution area, a line sparse distribution area, a solder mask layer, and a signal layer. A first signal line is laid on the signal layer. The first signal line crosses the line intensive distribution area and the line sparse distribution area. The first signal line is narrower in the line intensive distribution area than in the line sparse distribution area. The solder mask layer is thicker in the line intensive distribution area than in the line sparse distribution area.

11 Claims, 3 Drawing Sheets

PRINTED CIRCUIT BOARD

BACKGROUND

1. Technical Field

The present disclosure relates to printed circuit boards that can transmit all signals with a high degree of integrity.

2. Description of Related Art

Complex chips have a plurality of pins. After a complex chip is attached on a printed circuit board, each the plurality of pins is connected to an electronic component via a signal line. The signal lines are intensive and high-density around the mounting area of the complex chip. The signal lines on the intensive area are created narrower and distance between two adjacent signal lines is small, which can allow degradation of the signals transmitted on the signal lines of the intensive area.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
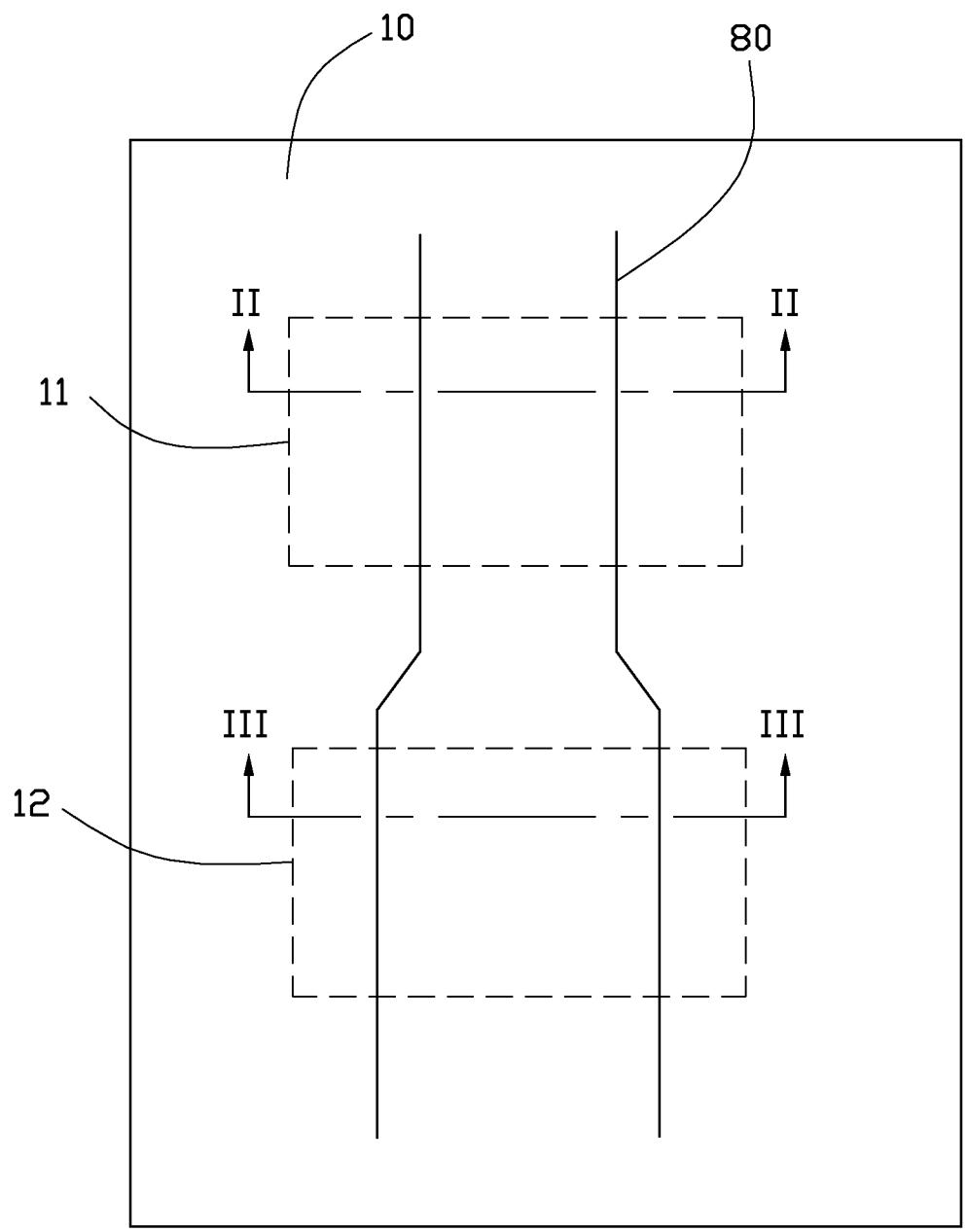
FIG. 1 is a plan view of an embodiment of a printed circuit board.

Referring to FIG. 1, a printed circuit board 10 in accordance with an embodiment includes an area with a high density of signal lines (line intensive distribution area 11) and an area containing a lower density of signal lines (line sparse distribution area 12). Lines laid in the line intensive distribution area 11 are intensive, and lines laid in sparse distribution area 12 are fewer in number and more spaced out. Two signal lines 80 are laid on the printed circuit board 10 and cross the line intensive distribution area 11 and the line sparse distribution area 12. In one embodiment, a complex chip is mounted on the line intensive distribution area 11.

Figure 2:
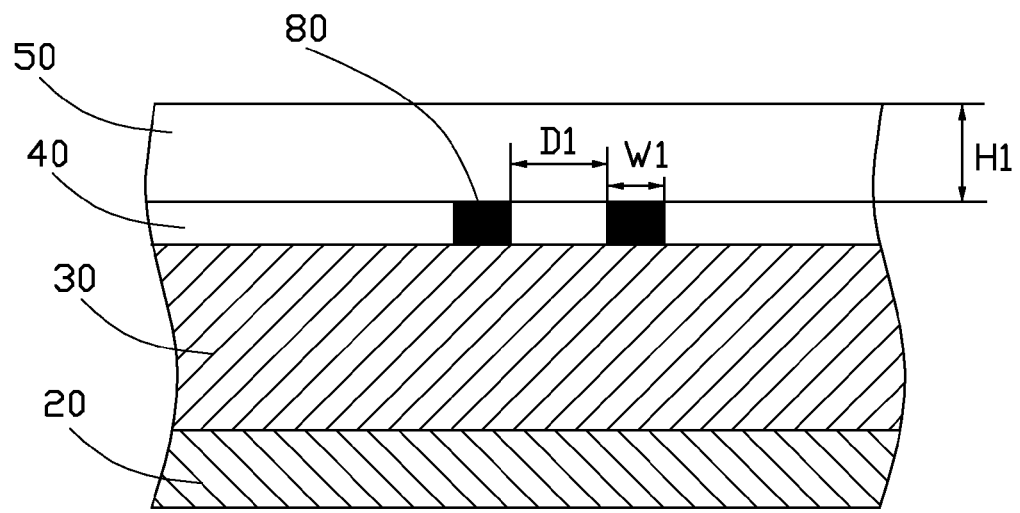
FIG. 2 is a cross sectional view along the line II-II of FIG. 1.
Figure 3:
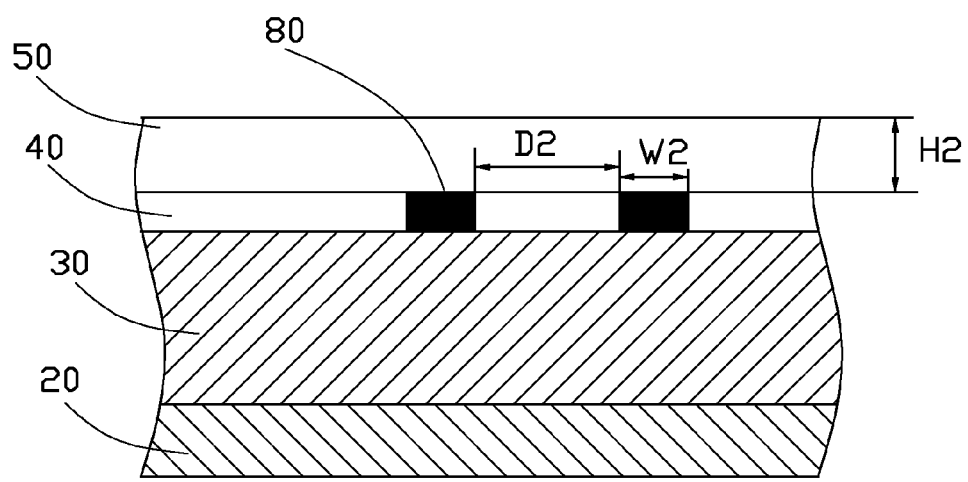
FIG. 3 is a cross sectional view along the line III-III of FIG. 1.

Referring to FIGS. 1 to 3, the printed circuit board 10 includes a ground layer 20, an insulating layer 30, a signal layer 40, and a solder mask layer 50. The ground layer 20 is located on the undermost portion of the printed circuit board 10. The insulating layer 30 is located above the ground layer 20. The signal layer 40 is located above the insulating layer 30. The solder mask layer 50 is located above the signal layer 40 and on the topmost portion of the printed circuit board 10. The two signal lines 80 are located on the signal layer 40.

In the line intensive distribution area 11, width of each of the two signal lines 80 is set to a first width W1, a distance between the two signal lines 80 is set to a first distance D1, and a thickness of the solder mask layer 50 is set to a first thickness H1.

In the line sparse distribution area 12, width of each of the two signal lines 80 is set to a second width W2, the distance between the two signal lines 80 is set to a second distance D2, and the thickness of the solder mask layer 50 is set to a second thickness H2.

In the printed circuit board 10, the first width W1 is less than the second width W2, the first distance D1 is less than the second distance D2, and the first thickness H1 is larger than the second thickness H2. The solder mask layer 50 is thicker in the line intensive distribution area 11 than in the line sparse distribution area 12. Therefore, solder mask signal is leaked less from the line intensive distribution area 11 than in the line sparse distribution area, and outer interference signal through the solder mask layer 50 in the line intensive distribution area 11 is less than in the line intensive distribution area 11. Thus, even if the signal lines 80 are physically narrow and the distance between the two signal lines 80 is small within the line intensive distribution area 11, signals transmitted by the two signal lines 80 are still clear and clean because of the protection of the thicker solder mask layer 50.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A printed circuit board, comprising:
    a line intensive distribution area and a line sparse distribution area;
    a solder mask layer; and
    a signal layer having a first signal line laid thereon;
    wherein the first signal line crosses the line intensive distribution area and the line sparse distribution area, the first signal line is narrower in the line intensive distribution area than in the line sparse distribution area, and the solder mask layer is thicker in the line intensive distribution area than in the line sparse distribution area.

2. The printed circuit board of claim 1, wherein a second signal line is laid on the signal layer, a distance between the first signal line and the second signal line in the line intensive distribution area is set to be a first distance, a distance between the first signal line and the second signal line in the line sparse distribution area is set to be a second distance, and the first distance is less than the second distance.

3. The printed circuit board of claim 1, wherein the signal layer is located below the solder mask layer.

4. The printed circuit board of claim 3, wherein an insulating layer is located below the signal layer.

5. The printed circuit board of claim 4, wherein a ground layer is located below the insulating layer.

6. A printed circuit board, comprising:
    a solder mask layer;
    a line intensive distribution area on which signal lines laid is laid intensively;
    a line sparse distribution area on which signal lines laid is laid sparsely;
    a first signal line and a second signal line crossing the line intensive distribution area and the line sparse distribution area, the first signal line parallel to the second signal line, a distance between the first signal line and the second signal line in the line intensive distribution area is set to be a first distance, a distance between the first signal line and the second signal line in the line sparse distribution area is set to be a second distance, and the first distance is less than the second distance, and the solder mask layer is thicker in the line intensive distribution area than in the line sparse distribution area.

7. The printed circuit board of claim 6, wherein each of the first signal line and the second signal line is narrower in the line intensive distribution area than in the line sparse distribution area.

8. The printed circuit board of claim 6, wherein the first signal line and the second signal line are laid on a signal layer.

9. The printed circuit board of claim 8, wherein the signal layer is located below the solder mask layer.

10. The printed circuit board of claim 9, wherein an insulating layer is located below the signal layer.

11. The printed circuit board of claim 10, wherein a ground layer is located below the insulating layer.

\* \* \* \* \*